(12) United States Patent
Matsui

(10) Patent No.: US 11,233,375 B2
(45) Date of Patent: Jan. 25, 2022

(54) TWO-KAPPA DBR LASER

(71) Applicant: II-VI DELAWARE, INC., Wilmington, DE (US)

(72) Inventor: Yasuhiro Matsui, Milpitas, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 256 days.

(21) Appl. No.: 16/691,553

(22) Filed: Nov. 21, 2019

(65) Prior Publication Data

US 2021/0098969 A1      Apr. 1, 2021

Related U.S. Application Data

(60) Provisional application No. 62/938,151, filed on Nov. 20, 2019, provisional application No. 62/908,990, filed on Oct. 1, 2019.

(51) Int. Cl.
| | |
|---|---|
| *H01S 5/125* | (2006.01) |
| *H01S 5/026* | (2006.01) |
| *H01S 5/042* | (2006.01) |
| *H01S 5/028* | (2006.01) |
| *H01S 5/0625* | (2006.01) |

(Continued)

(52) U.S. Cl.
CPC .............. *H01S 5/125* (2013.01); *H01S 5/026* (2013.01); *H01S 5/0287* (2013.01); *H01S 5/0427* (2013.01); *H01S 5/06256* (2013.01); *H01S 5/06258* (2013.01); *H01S 5/124* (2013.01); *H01S 5/141* (2013.01); *H01S 5/34* (2013.01)

(58) Field of Classification Search
CPC .... H01S 5/125; H01S 5/0287; H01S 5/06256; H01S 5/06258; H01S 5/124; H01S 5/141; H01S 5/026; H01S 5/0427
See application file for complete search history.

(56) References Cited

U.S. PATENT DOCUMENTS

| | | |
|---|---|---|
| 4,908,833 A | 3/1990 | Chraplyvy et al. |
| 10,063,032 B2 | 8/2018 | Matsui |

(Continued)

FOREIGN PATENT DOCUMENTS

| | | | | |
|---|---|---|---|---|
| EP | 1850429 A1 | * | 10/2007 | ......... H01S 5/06256 |
| KR | 20100072534 A | * | 7/2010 | ......... H01S 5/06256 |

OTHER PUBLICATIONS

Machine translation of KR 20100072534 A (Year: 2010).*

(Continued)

*Primary Examiner* — Yuanda Zhang
(74) *Attorney, Agent, or Firm* — Blank Rome LLP

(57) ABSTRACT

A two-kappa DBR laser includes an active section, a HR mirror, a first DBR section, and a second DBR section. The HR mirror is coupled to a rear of the active section. The first DBR section is coupled to a front of the active section, the first DBR section having a first DBR grating with a first kappa κ1. The second DBR section is coupled to a front of the first DBR section such that the first DBR section is positioned between the active section and the second DBR section. The second DBR section has a second DBR grating with a second kappa κ2 less than the first kappa κ1. The two-kappa DBR laser is configured to operate in a lasing mode and has a DBR reflection profile that includes a DBR reflection peak. The lasing mode is aligned to a long wavelength edge of the DBR reflection peak.

20 Claims, 6 Drawing Sheets

(51) Int. Cl.
  *H01S 5/12* (2021.01)
  *H01S 5/14* (2006.01)
  *H01S 5/34* (2006.01)

(56) References Cited

U.S. PATENT DOCUMENTS

| | | |
|---|---|---|
| 2005/0238079 A1 | 10/2005 | Botez |
| 2010/0265980 A1 | 10/2010 | Matsuda |
| 2010/0272133 A1 | 10/2010 | Kato |
| 2011/0299561 A1 | 12/2011 | Akiyama |
| 2013/0308178 A1 | 11/2013 | Matsui |
| 2014/0269807 A1 | 9/2014 | Matsui |
| 2016/0064897 A1 | 3/2016 | Higa et al. |
| 2016/0164257 A1 | 6/2016 | Adachi et al. |

OTHER PUBLICATIONS

Machine translation of EP 1850429 A1 (Year: 2007).*

Matsui—Book, Datacenter Connectivity Technologies: Principles and Practice, ISBN 9788793609228, River Publishers Series in Optics and Photonics, Chapter 3—"Directly Modulated Laser Technology: Past, Present, Future" River Publishers Oct. 8, 2018 (86 Pgs.).

Dumitrescu, et al., "Distributed Feedback Lasers with Photon-Photon-Resonance-Enhanced Modulation Bandwidth" Semiconductor Conference, 2012 International IEEE, Oct. 15, 2012, 4 pgs.

Radziunas, et al., "Improving the Modulation Bandwidth in Semiconductor Lasers by passive Feedback," IEEE Journal of Selected Topics in Quantum Electronics, IEEE Service Center, vol. 13, No. 1, Jan. 1, 2007, 8 pgs.

International Search Report and Written Opinion for International Application No. PCT/US2017/021014, dated May 12, 2017, 15 pgs.

Troppenz, et al., "40 Gbit/s Directly Modulated Lasers: Physics and Application" Proc. SPIE 7953, Novel In-Plane Semiconductor Lasers X, 79530F (Feb. 16, 2011) 10 pgs.

Chacinski, et al., "Effects of detuned loading on the modulation performance of widely tunable MG-Y lasers," Proc. SPIE 6997, Semiconductor Lasers and Laser Dynamics III, 699709 (May 8, 2008) 9 pgs.

Yamaoka, et al. "239.3-Gbit/s Net Rate PAM-4 Transmission Using Directly Modulated Membrane Lasers on High-Thermal-Conductivity SiC" The 45th European Conference on Optical Communication, Dublin, Sep. 22-26, 2019 4pgs.

* cited by examiner

TWO-KAPPA DBR LASER

CROSS-REFERENCE TO RELATED APPLICATIONS

This application claims the benefit of and priority to U.S. Provisional App. No. 62/908,990 filed on Oct. 1, 2019 and U.S. Provisional App. No. 62/938,151 filed on Nov. 20, 2019. The 62/908,990 application and the 62/938,151 application is each incorporated herein by reference.

FIELD

The embodiments discussed herein are related to a two-kappa distributed Bragg reflector (DBR) laser.

BACKGROUND

Unless otherwise indicated herein, the materials described herein are not prior art to the claims in the present application and are not admitted to be prior art by inclusion in this section.

Lasers are useful in a number of applications. For example, lasers may be used in optical communications to transmit digital data across a fiber optic network. The laser may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber optic network. Such fiber optic networks enable modern computing devices to communicate at high speeds and over long distances.

In various industries, bitrates for data transmission per channel have surpassed 100 gigabit per second (Gb/s), establishing transmitter performance exceeding 60 gigahertz (GHz) bandwidth (BW) as an industry goal for the 100 Gb/s non-return-to zero (NRZ) format. Although some electro absorption modulators have exhibited the capability to approach 60 GHz BW, the BW of directly modulated lasers (DML) such as directly modulated DFB lasers have lagged behind at approximately 30 GHz.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to a two-kappa DBR laser.

In an example embodiment, a two-kappa DBR laser includes a Fabry-Perot (FP) cavity that includes a high reflection (HR) mirror, a first DBR section, and an active section. The active section is positioned between the HR mirror and the first DBR section. The first DBR section includes a first DBR grating with a length L1 in a range from 10 micrometers to 30 micrometers and a first kappa $\kappa 1$. $\kappa 1 L1$ is in a range from 0.5 to 1.0. The two-kappa DBR laser also includes a second DBR section coupled to the FP cavity. The second DBR section includes a second DBR grating with a second kappa $\kappa 2$ that is less than the first kappa $\kappa 1$ of the first DBR section.

In another example embodiment, a two-kappa DBR laser includes an active section, a HR mirror, a first DBR section, and a second DBR section. The HR mirror is coupled to a rear of the active section. The first DBR section is coupled to a front of the active section and has a first DBR grating with a first kappa $\kappa 1$. The second DBR section is coupled to a front of the first DBR section such that the first DBR section is positioned between the active section and the second DBR section. The second DBR section has a second DBR grating with a second kappa $\kappa 2$ that is less than the first kappa $\kappa 1$. The two-kappa DBR laser is configured to operate in a lasing mode and has a DBR reflection profile that includes a DBR reflection peak. The lasing mode is aligned to a long wavelength edge of the DBR reflection peak.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

This application is related to U.S. Pat. No. 10,063,032 issued Aug. 28, 2018 and which is incorporated herein by reference.

Uncooled 53Gbaud PAM4 (100 Gb) DBR lasers need sufficient gain length (~100 micrometers) to improve the high temperature performance. However, simultaneously achieving good side-mode suppression ratio (SMSR) and high-speed is difficult using conventional DBR lasers that have a uniform grating design. Some embodiments herein include a two-kappa DBR laser that simultaneously achieves good SMSR and high-speed operation.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
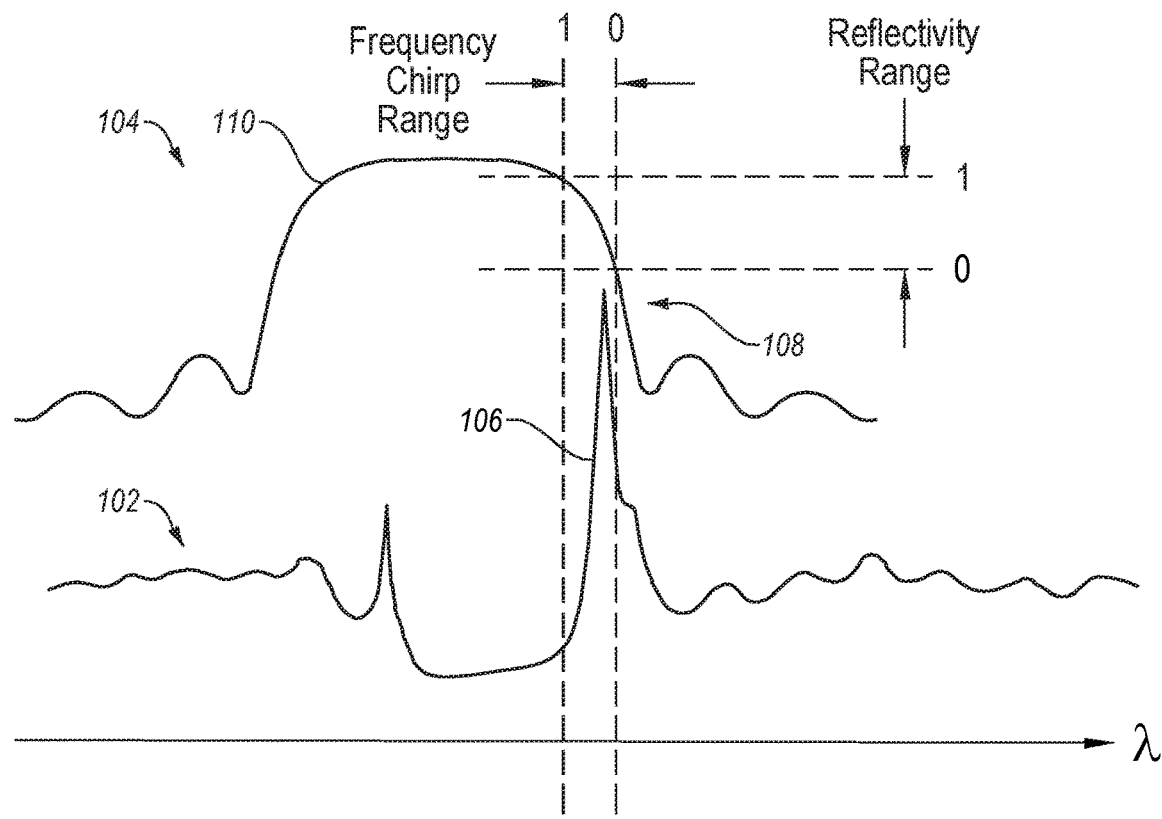
FIG. 1 illustrates an example modulation spectrum of an active section of a DBR laser relative to a DBR reflection profile of a DBR section of the DBR laser.

FIG. 1 illustrates an example modulation spectrum 102 of an active section of a DBR laser relative to a DBR reflection profile 104 of a DBR section of the DBR laser, arranged in accordance with at least one embodiment described herein. As illustrated, a main lasing mode 106 of the modulation spectrum 102 is aligned to a long wavelength edge 108 of a DBR reflection peak 110 of the DBR reflection profile 104. Accordingly, lasing of the active section occurs at a frequency (or wavelength) on the long wavelength edge of the DBR stop-band.

When the DBR laser is modulated (e.g., through modulation of the active section), lasing frequency changes due to frequency chirp toward shorter wavelength as the modulation goes from the bias for the 0 bits to the bias for the 1 bits and toward longer wavelength as the modulation goes from the bias for the 1 bits to the 0 bits. The frequency/wavelength of the main lasing mode 106 for each of the 1 and 0 bits is designated in FIG. 1 by a corresponding vertical dashed line labeled with, respectively, a 1 or a 0.

The frequency chirp caused by modulation results in a change in reflection as the main lasing mode 106 moves up and down the long wavelength edge of the reflection profile 104. In particular, when the modulation goes from the bias for the 0 bits to the 1 bits, the wavelength of the main lasing mode 106 shifts toward shorter wavelength resulting in increased reflection and thus lower cavity loss. When the modulation goes from the bias for the 1 bits to the 0 bits, the wavelength of the main lasing mode 106 shifts toward longer wavelength resulting in decreased reflection and thus higher cavity loss. The reflectivity of the DBR region of the DBR laser at the wavelengths corresponding to each of the 1 and 0 bits is designated in FIG. 1 by a corresponding horizontal dashed line labeled with, respectively, a 1 or a 0.

In more detail, rapid current modulation of the active section of the DBR laser induces carrier density variations in the DBR laser. This gives rise not only to optical gain fluctuations but also index fluctuations due to the so called alpha-parameter of the material. These gain and index-fluctuations give in turn rise to intensity and frequency fluctuations of the laser light, respectively. The relative amount of frequency modulation compared to the intensity modulation of the DBR laser is described by the chirp factor, also called the alpha-parameter or linewidth enhancement factor of the structure. When the DBR laser is detuned so that the lasing mode 106 is located on the long-wavelength edge 108 of the DBR reflection peak 110, the index modulation gives rise to modulation of the cavity losses which decreases or increases the effective (netgain) modulation of the DBR laser. Thus, laser chirp is translated into an effective enhancement of the differential gain, and thus improves the speed of the DBR laser. The detuned-loading effect includes the effect(s) that occur under modulation when the lasing mode 106 is aligned to the long-wavelength edge 108 of the DBR reflection peak 108, which may include one or more of effective enhancement of the differential gain, improved speed, and increased bandwidth.

The slope of the long wavelength edge 108 may determine a magnitude of the detuned-loading effect. In general, the detuned-loading effect may be more pronounced for steeper slope. The slope of the long wavelength edge 108 and the width of the DBR stopband may be determined by the length and/or kappa of a DBR grating in the DBR section. In general, for example, longer length of the DBR section may result in steeper long wavelength edge 108 and narrower DBR stopband. Further, the narrower the DBR stopband, the better the SMSR.

In typical DBR lasers, however, the configuration of a DBR grating with a steeper long wavelength edge 108 and narrower DBR stopband allows "reactive photons" (also referred to as "confined photons") to penetrate relatively deeply into the DBR grating. Reactive photons within the active section can contribute to high speed modulation while those outside the active section do not. As such, high speed modulation may be improved with improved longitudinal confinement (e.g., shallow penetration) of reactive photons relative to the DBR grating.

Embodiments described herein may include DBR lasers with a high reflection (HR) mirror, an active section, and first and second DBR sections, each of the first and second DBR sections having a corresponding first or second DBR grating with a different corresponding first or second kappa. DBR lasers with two different DBR gratings having different kappas may be referred to herein as two-kappa DBR lasers. The active section may be positioned between the HR mirror and the first DBR section, the foregoing components forming a Fabry-Perot (FP) cavity. The second DBR section may be coupled to the first DBR section. The first DBR section may be relatively short and the first kappa may be relatively strong. The second DBR section may be relatively long and the second kappa may be relatively weak. A reflection profile of the first DBR section may have a broad DBR reflection peak with a relatively low maximum value. A reflection profile of the second DBR may have a relatively narrow DBR reflection peak with a relatively high maximum value and relatively steep slope on the long wavelength edge. Accordingly, the two-kappa DBR may in aggregate simultaneously have both relatively high SMSR and relatively shallow penetration depth for high-speed operation.

Figure 2:
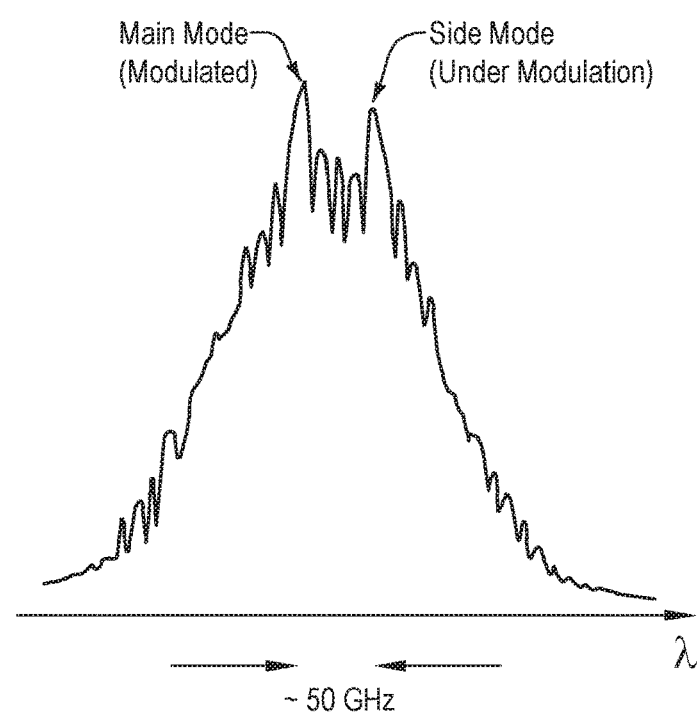
FIG. 2 illustrates an example lasing mode and side mode of a laser with photon-to-photon resonance (PPR)

Embodiments described herein may additionally leverage the photon-photon resonance (PPR) effect to improve performance. When a DML such as a DFB laser or DBR laser is modulated, modulation sidebands broaden the spectrum of the DML around the main lasing mode. If the side mode of the laser cavity is present within the modulation spectrum, such sidebands can be coupled into the side mode and be resonantly amplified. This situation is depicted in FIG. 2. This effect is called the PPR effect and can enhance the modulation response at around a frequency corresponding to the frequency difference between the main and side modes. The frequency separation between the lasing mode and the PPR mode may be referred to as the PPR frequency. Embodiments described herein may have a PPR frequency in a range from 20 GHz to 80 GHz or other suitable PPR frequency.

Figure 3A:
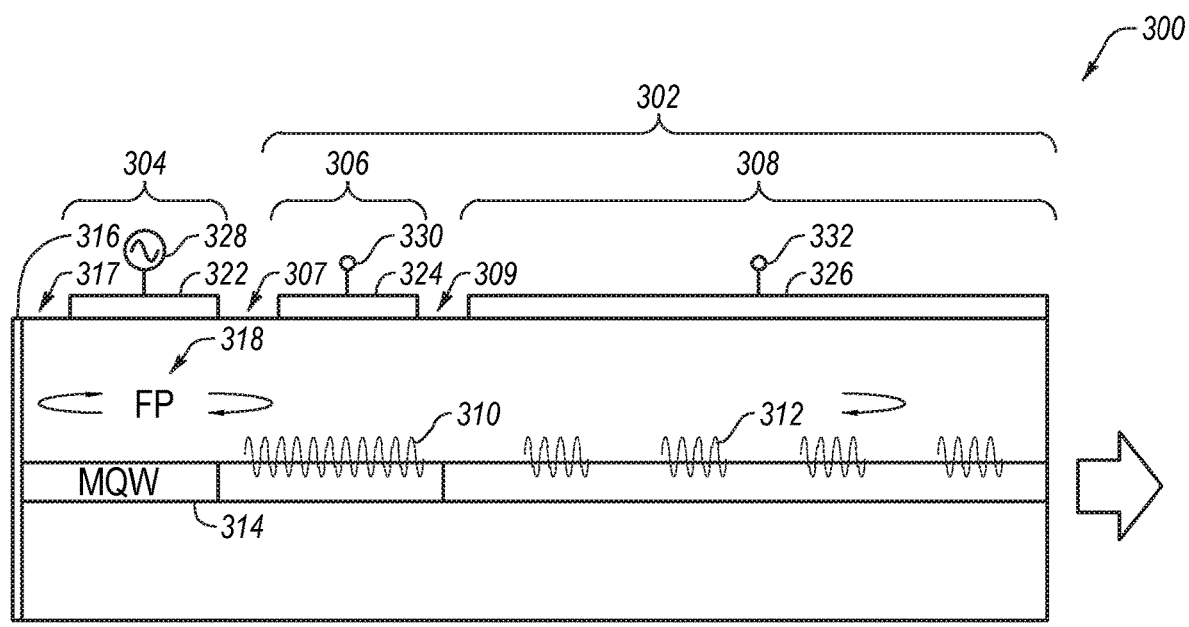
FIG. 3A illustrates an example two-kappa DBR laser.

FIG. 3A illustrates an example two-kappa DBR laser 300, arranged in accordance with at least one embodiment described herein. As illustrated, the two-kappa DBR laser 300 includes a passive section 302 and an active section 304. The passive section 302 may have a length in a range from 120 to 250 micrometers or more. The active section 304 may have a length in a range from 50 to 150 micrometers.

The passive section 302 may include a first DBR section 306 and a second DBR section 308. The first DBR section 306 may be coupled to a front 307 of the active section 304. The second DBR section 308 may be coupled to a front 309 of the first DBR section 306.

The first DBR section 306 may have a first DBR grating 310 with a first kappa. The first DBR section 306 may be relatively short, such as 30 micrometers or less, or in a range from 10 to 30 micrometers. In the example of FIG. 3A, the length of the first DBR section 306 may be 15 micrometers. Alternatively, the first DBR section 306 may have a length in a range from 30 to 100 micrometers. The first kappa of the first DBR grating 310 may be relatively strong, such as at least 250 per centimeter ($cm^{-1}$), or more or less than 250 $cm^{-1}$. In the example of FIG. 3A, the first kappa of the first DBR grating 310 may be 500 $cm^{-1}$. In some embodiments, the first DBR grating 310 may have a kappa×length, or κL value, in a range from 0.5 to 1.0. For example, the first DBR grating 310 may have a length L of 15 micrometers, a kappa κ of 500 $cm^{-1}$, and a κL of 0.75.

The second DBR section 308 may have a second DBR grating 312 with a second kappa. The second DBR section 306 may be relatively long, such as 120 micrometers or more, or in a range from 120 to 250 micrometers. In the example of FIG. 3A, the length of the second DBR section 308 may be 150 micrometers. The second kappa of the second DBR grating 312 may be less than the first kappa of the first DBR grating 310. For example, the second kappa of the second DBR grating 312 may be 80 $cm^{-1}$ or less. In some embodiments, the second DBR grating 312 may have a κL value in a range from 0.5 to 1.0. For example, the second DBR grating 312 may have a length L of 200 micrometers, a kappa κ of 43 $cm^{-1}$, and a κL of 0.86.

As illustrated in FIG. 3A, the second DBR grating 312 includes a sampled grating with an effective kappa of 80 $cm^{-1}$. In general, the kappa of a DBR grating as used herein may refer to the effective kappa of the DBR grating which may be the same as the actual kappa in the case of a uniform grating.

The active section 304 may include a multiple quantum well (MQW) gain layer 314 or other suitable gain layer and may be configured to operate in a lasing mode. In the example of FIG. 3A, the active section 304 may have a length of 50 micrometers.

An HR mirror 316, also referred to as a rear mirror, is formed at a rear 317, e.g., on a rear facet, of the active section 304. The HR mirror 316 may be coupled to the rear 317 of the active section 304. The HR mirror 316 may have a reflectivity of 30% or more. The HR mirror 316, the active section 304, and the first DBR section 306 may form a Fabry-Perot (FP) cavity 318, which may increase a longitudinal confinement factor of the two-kappa DBR laser 300 compared to uniform (e.g., single kappa) DBR lasers. Addition of the second DBR section 308 at the output of the FP cavity 318 creates the detuned-loading effect in the two-kappa DBR laser 300. Accordingly, modulation of the active section 304 may modulate cavity loss and increase intrinsic speed of the two-kappa DBR laser 300.

As illustrated in FIG. 3A, the two-kappa DBR laser 300 may additionally include modulation contact 322 and first and second bias contacts 324, 326 electrically coupled to, respectively, the active section 304, the first DBR section 306, and the second DBR section 308.

A modulation signal 328 may be provided through the modulation contact 322 to the active section 304 to modulate the active section 304. Modulation of the active section 304 may modulate the cavity loss of the two-kappa DBR laser 300 and may increase a carrier-photon resonance frequency ($F_r$) of the two-kappa DBR laser 300.

A first bias signal 330 may be provided through the first bias contact 324 to the first DBR section. A second bias signal 332 may be provided through the second bias contact 326 to the second DBR section. Alternatively or additionally, current tuning may be applied to one or both of the first and second DBR sections 306, 308 as described elsewhere herein to tune PPR frequency of the two-kappa DBR laser 300.

In some embodiments, the two-kappa DBR laser 300 may further include a low reflection (LR) mirror formed at the output facet of the second DBR section 308 to improve SMSR. The LR mirror may have a reflectivity of, e.g., 1% or less.

Figure 3B:
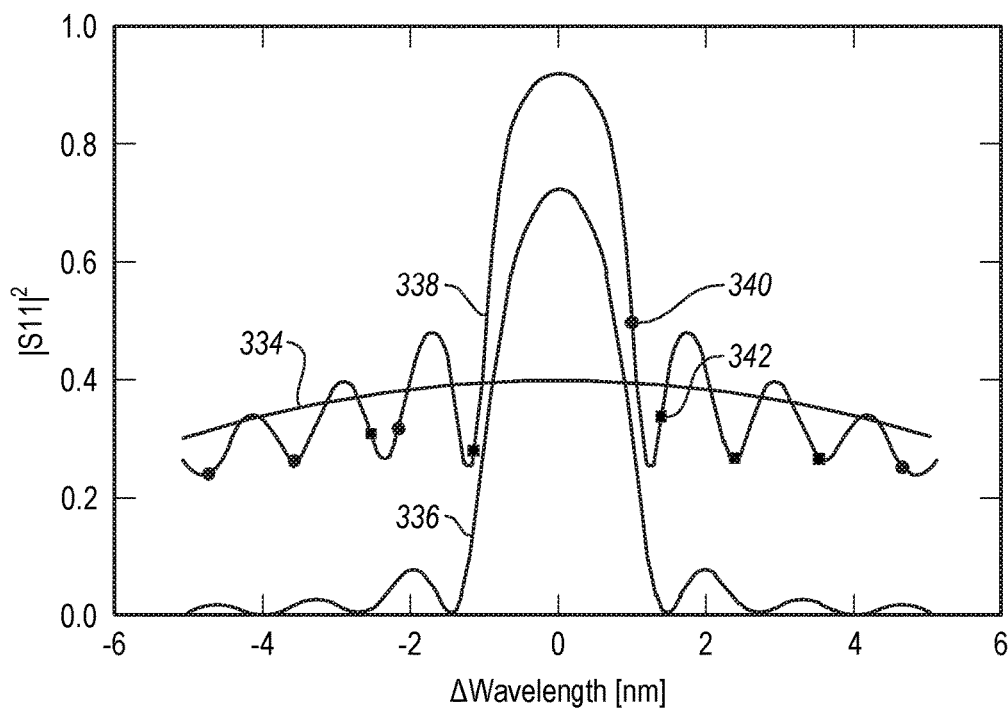
FIG. 3B illustrates various reflection profiles associated with the two-kappa DBR laser of FIG. 3A.

FIG. 3B illustrates a reflection profile 334 of the first DBR section 306 (hereinafter first DBR reflection profile 334), a reflection profile 336 of the second DBR section 308 (hereinafter second DBR reflection profile 336), and a reflection profile 338 of the two-kappa DBR laser 300 as a whole (hereinafter two-kappa DBR laser reflection profile 338), arranged in accordance with at least one embodiment described herein. As illustrated by the first DBR reflection profile 334, the first DBR section 306 has a broad DFB reflection peak with a relatively low maximum reflection. As illustrated by the second DBR reflection profile 336, the second DBR section 308 has a much narrower DFB reflection peak with relatively steep long wavelength edge. The two-kappa DBR laser reflection profile 338 is the aggregate reflection profile of the two-kappa DBR laser 300 from the combination of the first and second DBR reflection profiles 334, 336. As illustrated, the long wavelength edge of the two-kappa DBR laser reflection profile 338 is even steeper at the lasing mode 340 of the active section 304 than the long wavelength edge of the second DBR reflection profile 336. The long wavelength edge of the DFB reflection peak of the two-kappa DBR laser reflection profile 338 may have a slope of at least 0.002 $GHz^{-1}$, such as a slope of about 0.006 $GHz^{-1}$ at a lasing mode 340 of the two-kappa DBR laser 300. In some embodiments, the slope may be in a range from 0.002 $GHz^{-1}$ to 0.009 $GHz^{-1}$.

FIG. 3B further illustrates a PPR mode 342 of the two-kappa DBR laser 300. The PPR mode 342 may have a PPR frequency in a range of 20 GHz to 80 GHz. Alternatively or additionally, the PPR frequency may be tuned over a range by detuning the first and second DBR sections 306, 308 relative to each other with current tuning. The tuning range of the PPR frequency may be 20 GHz to 80 GHz.

Figure 3C:
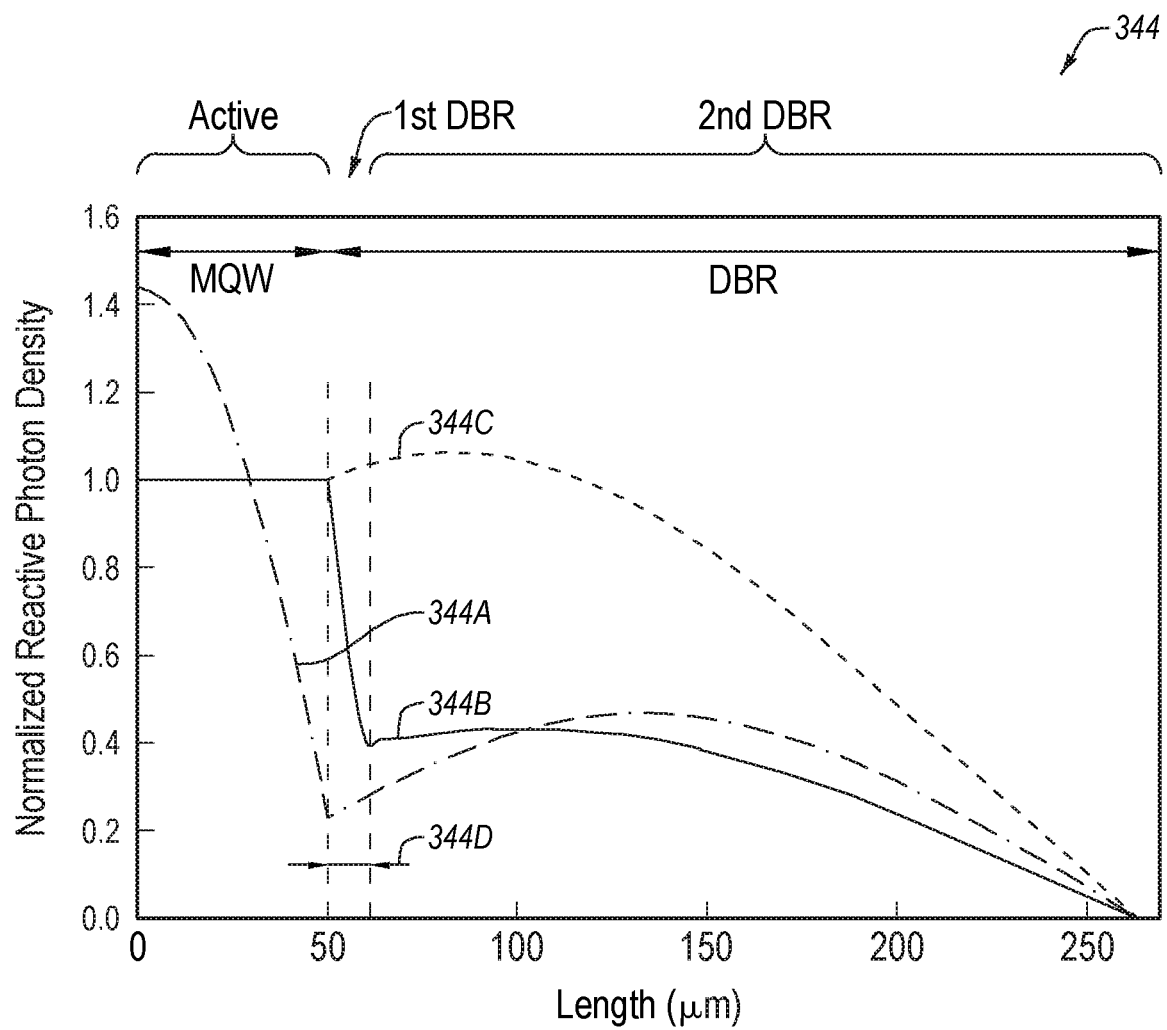
FIG. 3C illustrates distributions of reactive photons during lasing in three different example lasers that include the two-kappa DBR laser of FIG. 3A.

FIG. 3C illustrates distributions 344 of reactive photons during lasing in three different example lasers, arranged in accordance with at least one embodiment described herein. The three example lasers include a distributed reflector (DR) laser as disclosed in the U.S. Pat. No. 10,063,032, a DBR laser with a uniform kappa, and the two-kappa DBR laser 300 of FIG. 3A. In FIG. 3C, the distributions 344 are normalized over the active section. Labels, e.g., "MQW" and "DBR", and arrows across the top of the graph of the distributions 344 indicate the locations of the MQW or active region and of a DBR region (made up of the first and second DBR sections 306, 308 in the case of the two-kappa DBR laser 300) in all three example lasers. The distributions 344 include a distribution 344A of the DR laser, a distribution 344B of the two-kappa DBR laser 300, and a distribution 344C of the DBR laser with a uniform kappa. For the distribution 344B of the two-kappa DBR laser 300, a region 344D in the DBR section corresponds to the first DBR section 306 of the two-kappa DBR laser 300, with a remainder of the DBR section in the distribution 344B corresponding to the second DBR section 308.

As illustrated by the distribution 344B, the first DBR section 306 generally confines the reactive photons to the active section 304. As illustrated, the distribution 344B of reactive photons drops significantly from the active section 304 through the first DBR section 306 to the second DBR section 308. In an example, the distribution 344 of reactive photons may drop by at least 50% through the first DBR section 306 from the active section 304 to the second DBR section 308. As illustrated by the distribution 344C, significantly more light penetrates into the passive/DBR section of the DBR laser with uniform kappa, which dilutes differential gain and slows the DBR laser with uniform kappa.

Figure 3D:
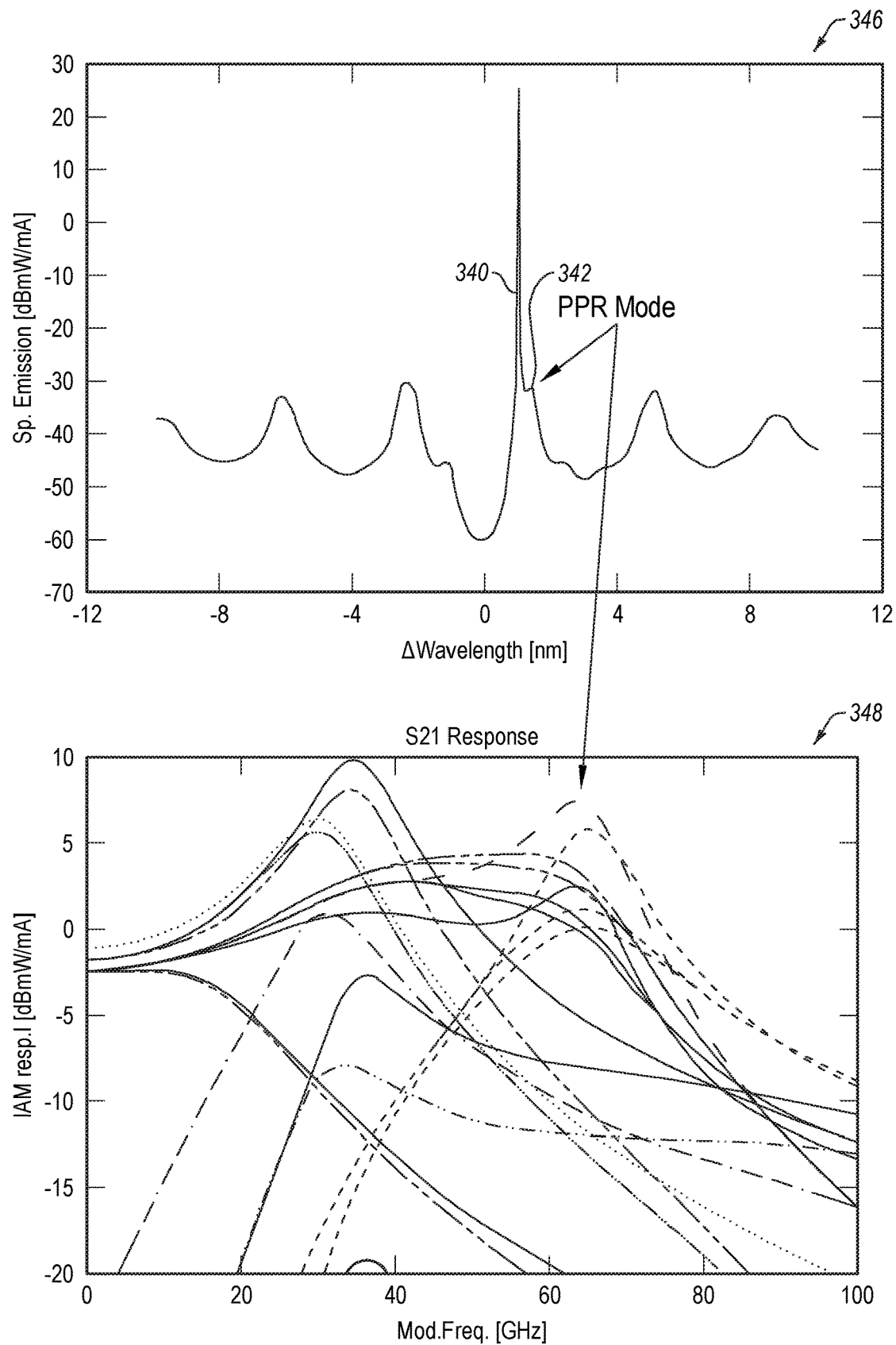
FIG. 3D illustrates a modulation spectrum and various S21 responses of the two-kappa DBR laser of FIG. 3A.

FIG. 3D illustrates a modulation spectrum 346 and various S21 responses 348 of the two-kappa DBR laser 300 of FIG. 3A, arranged in accordance with at least one embodiment described herein. The modulation spectrum 346 includes the lasing mode 340 and the PPR mode 342. The frequency difference between the lasing mode 340 and the PPR mode 342 may be referred to as the PPR frequency. The PPR frequency appears in the S21 responses 348 as the peaks at around 60 GHz.

Embodiments of the two-kappa DBR laser 300 with a 50 micrometer active section 304 may have a 3 dB bandwidth at room temperature of about 30 GHz or more such as 35 GHz for 50 Gbaud PAM4, or even 60 GHz or more such as 65 GHz. Embodiments of the two-kappa DBR laser 300 with a 100 micrometer active section 304 may have a 3 dB bandwidth at 70 C of 50 GHz or more.

Figure 4:
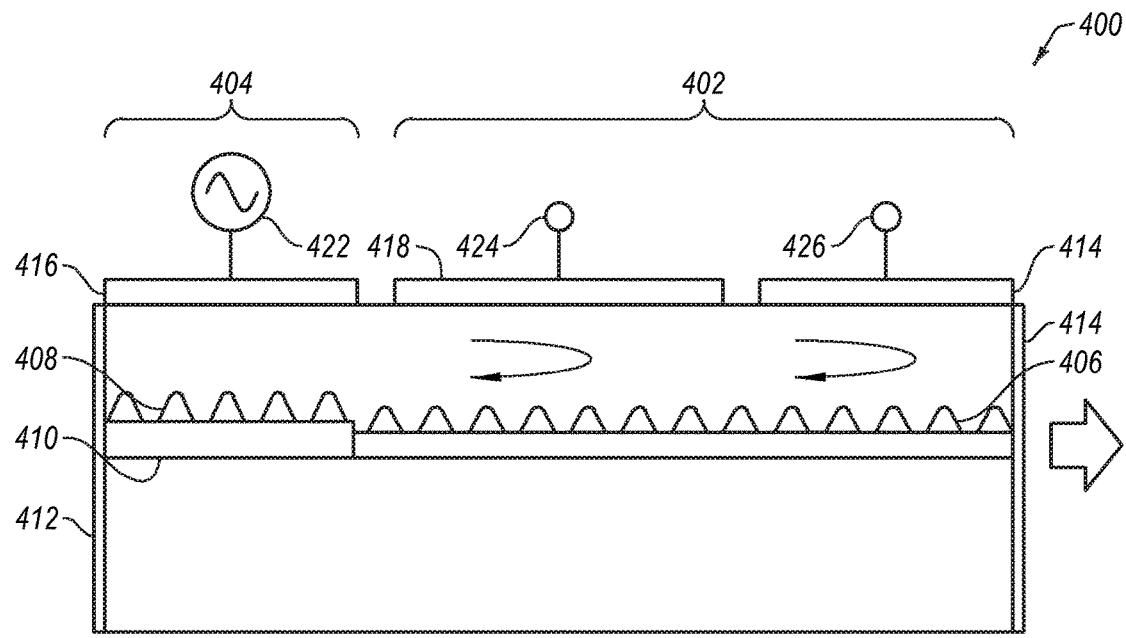
FIG. 4 illustrates an example split-contact DR laser.

FIG. 4 illustrates an example split-contact DR laser 400, arranged in accordance with at least one embodiment described herein. As illustrated, the split-contact DR laser 400 includes a passive section 402 and an active section 404. The passive section 402 may have a length of about 215 micrometers or other suitable length. The active section 404 may have a length of about 50 micrometers or other suitable length.

The passive section 402 includes a DBR grating 406, e.g., with a uniform kappa. The active section includes a DFB grating 408 formed in or above an active region, such as in or above a MQW layer 410.

An HR mirror 412, also referred to as a rear mirror, is formed on a rear facet of the active section 404. The HR mirror 412 may have a reflectivity of 30% or more.

An antireflection (AR) coating 414 may be formed on a front facet of the passive section 402.

As illustrated in FIG. 4, the split-contact DR laser 400 may additionally include modulation contact 416 and first and second bias contacts 418, 420. The modulation contact 416 is electrically coupled to the active section 404. The first bias contact 418 is electrically coupled to a first portion of the passive section 402 that may have a length of about 140 micrometers. The second bias contact 420 is electrically coupled to a second portion of the passive section 402 that may have a length of about 75 micrometers. A modulation signal 422 may be provided through the modulation contact 416 to the active section 404. A first bias signal 424 may be provided through the first bias contact 418 to the first portion of the passive section 402. A second bias signal 426 may be provided through the second bias contact 420 to the second portion of the passive section.

Current tuning may be applied to one or both of the first and second bias contacts 418, 420 to tune PPR frequency of the split-contact DR laser 400. For example, by applying different bias signals 424, 426 to the first and second bias contacts 418, 420, the first and second portions of the passive section 402 may be tuned relative to each other to tune the PPR frequency of the split-contact DR laser 400.

Figure 5:
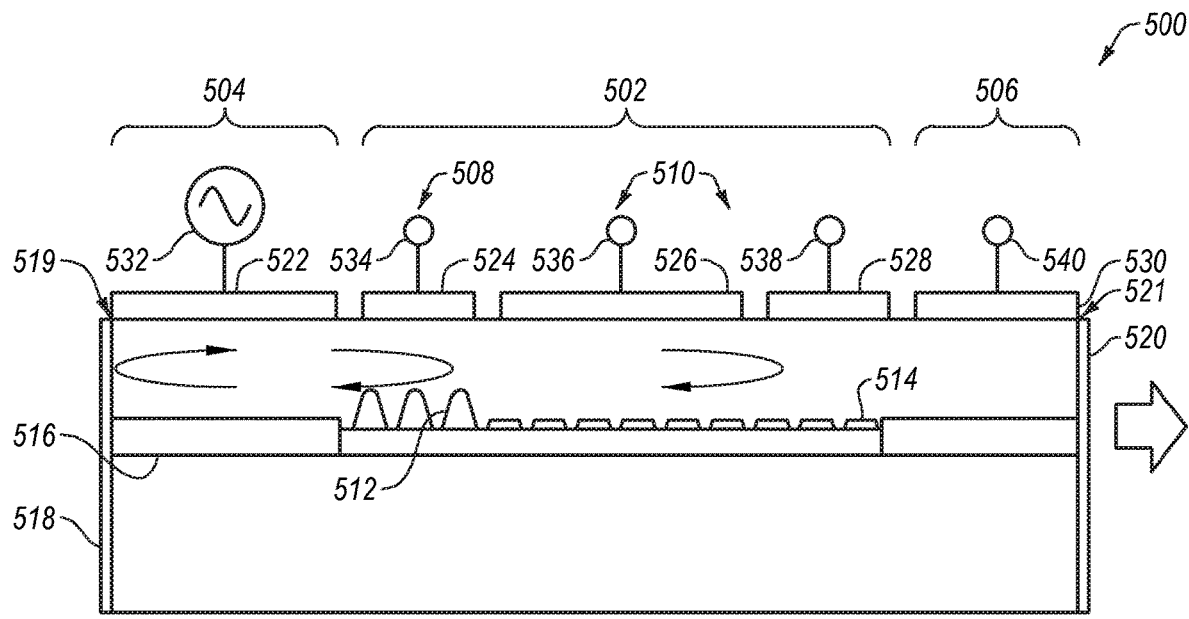
FIG. 5 illustrates another example two-kappa DBR laser.

FIG. 5 illustrates another example two-kappa DBR laser 500, arranged in accordance with at least one embodiment described herein. As illustrated, the two-kappa DBR laser 500 includes a passive section 502, an active section 504, and optionally a semiconductor optical amplifier (SOA) section 506. The passive section 502 may have a length of about 215 micrometers or other suitable length. The active section 504 may have a length of about 50 micrometers or other suitable length. The passive section 502 and the active section 504 may be the same as or similar to the passive section 302 and the active section 304 of the two-kappa DBR laser 300 of FIG. 3 except as otherwise noted herein.

The passive section 502 may include a first DBR section 508 and a second DBR section 510. The first DBR section 508 may have a first DBR grating 512 with a first kappa. The length of the first DBR section 508 may be 15 micrometers or other suitable length. The second DBR section 510 may have a second DBR grating 514 with a second kappa that is different and less than the first kappa. The length of the second DBR section 510 may be 200 micrometers or other suitable length.

The active section 504 includes an active region such as a MQW layer 516.

An HR mirror 518, also referred to as a rear mirror, is formed at a rear 519, e.g., on a rear facet, of the active section 504. The HR mirror 518 may be coupled to the rear 519 of the active section 504. The HR mirror 518 may have a reflectivity of 30% or more.

An antireflection (AR) coating 520 may be formed at a front 521, e.g., on a front facet of, the SOA section 506. The AR coating 520 may be coupled to the front 521 of the SOA section 506.

As illustrated in FIG. 5, the two-kappa DBR laser 500 may additionally include modulation contact 522, first bias contact 524, second bias contact 526, third bias contact 528, and fourth bias contact 530. The modulation contact 522 is electrically coupled to the active section 504. The first bias contact 524 is electrically coupled to the first DBR section 508. The second bias contact 526 is electrically coupled to a first portion of the second DBR section 510 that may have a length of about 140 micrometers or other suitable length. The third bias contact 528 is electrically coupled to a second portion of the second DBR section 510 may have a length of about 60 micrometers or other suitable length. The fourth bias contact 530 is electrically coupled to the SOA section 506.

In FIG. 5, the second DBR section 510 has a split contact, e.g., the second and third bias contacts 526, 528, as opposed to a single bias contact (e.g., the second bias contact 326) for the second DBR section 308 of FIG. 3. Accordingly, the two-kappa DBR laser 500 may be referred to as a split-contact two-kappa DBR laser 500.

A modulation signal 532 may be provided through the modulation contact 522 to the active section 504. Modulation of the active section 504 may modulate the cavity loss of the two-kappa DBR laser 500 and may increase a $F_r$ of the two-kappa DBR laser 500.

A first bias signal 534 may be provided through the first bias contact 524 to the first DBR section 508. A second bias signal 536 may be provided through the second bias contact 526 to the first portion of the second DBR section 510. A third bias signal 538 may be provided through the third bias contact 528 to the second portion of the second DBR section 510. A fourth bias signal 540 and/or a modulation signal may be provided through the fourth bias contact 530 to SOA section 506.

Current tuning may be applied to one or both of the second and third bias contacts 526, 528 to tune PPR frequency of the two-kappa DBR laser 500. For example, by applying different second and third bias signals 536, 538 to the second and third bias contacts 526, 528, the first and second portions of the second DBR section 510 of the passive section 502 may be tuned relative to each other to tune the PPR frequency of the two-kappa DBR laser 500.

Figure 6:
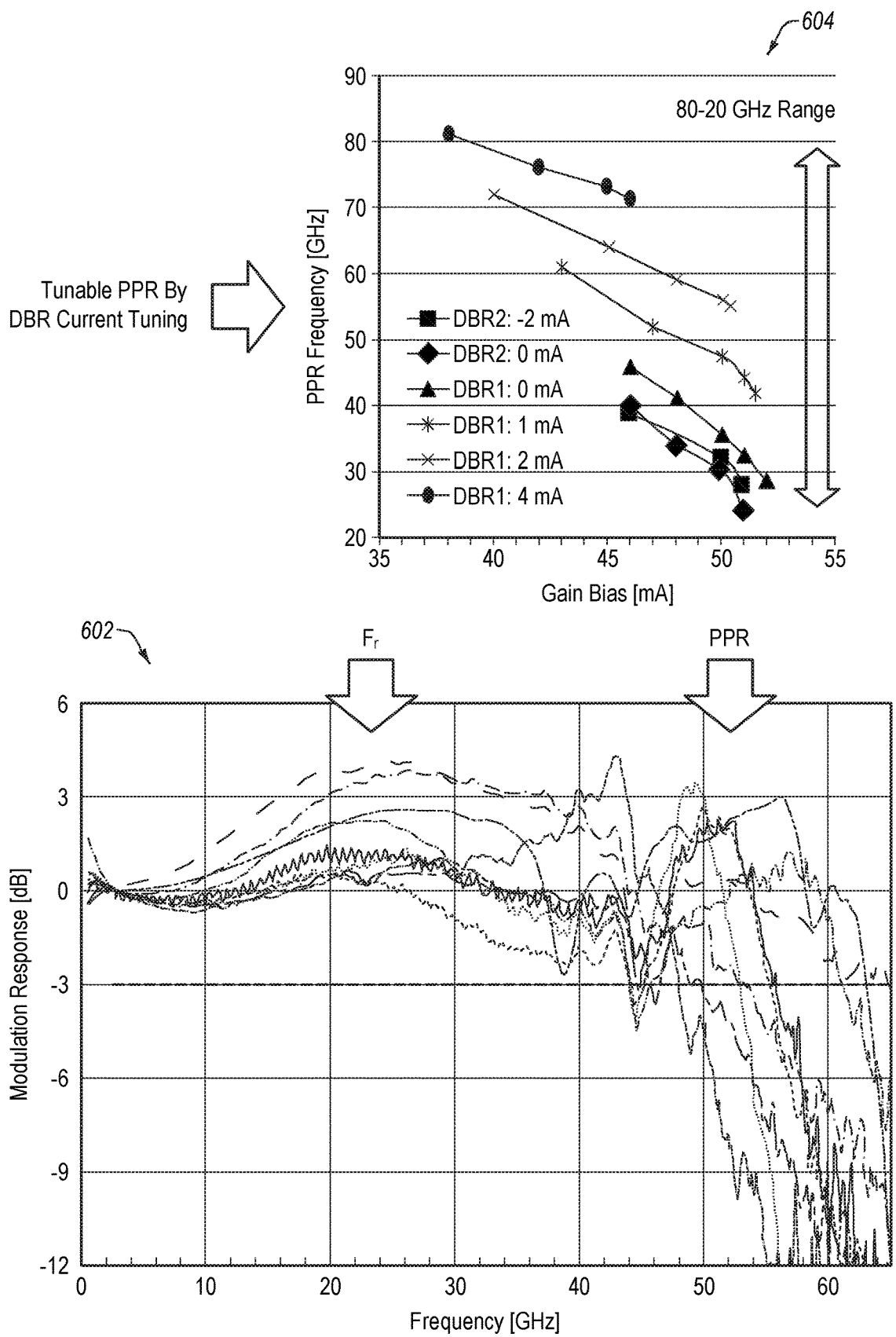
FIG. 6 illustrates modulation response and PPR tunability of the split-contact DR laser of FIG. 4, all arranged in accordance with at least one embodiment described herein.

FIG. 6 illustrates modulation response 602 and PPR tunability 604 of the split-contact DR laser 400 of FIG. 4, arranged in accordance with at least one embodiment described herein. Split-contact two-kappa DBR lasers, such as the two-kappa DBR laser 500 of FIG. 5, may similarly have PPR tunability. As illustrated by the modulation response 602, the split-contact DR laser 400 may have a $F_r$ of about 25 GHz.

As illustrated by the PPR tunability 604, the PPR frequency of the split-contact DR laser 400 may be tuned between 20 GHz to 80 GHz by application of an appropriate combination of gain bias and current tuning to one or more of the first portion of the passive section 402 (referred to as "DBR1 in FIG. 6") and the second portion of the passive section 402 (referred to as "DBR2" in FIG. 6).

For example, for gain bias of about 38 milliamp (mA) to about 46 mA with the first portion (DBR1) of the passive section 402 tuned by about 4 mA, the PPR frequency is in a range from about 81 GHz to about 71 GHz as depicted by the topmost curve (e.g., the curve marked with elliptical points) of the PPR tunability 604. As another example, for gain bias of about 40 mA to about 50 mA with the first portion (DBR1) tuned by about 2 mA, the PPR frequency is in a range from about 71 GHz to about 55 GHz as depicted by the next curve (e.g., the curve marked with x points) below the topmost curve of the PPR tunability 604.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural and/or singular terms herein, those having skill in the art can translate from the plural to the singular and/or from the singular to the plural as is appropriate to the context or application. The various singular/plural permutations may be expressly set forth herein for sake of clarity. A reference to an element in the singular is not intended to mean "one and only one" unless specifically stated, but rather "one or more."Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A two-kappa distributed Bragg reflector (DBR) laser, comprising:
   a Fabry-Perot (FP) cavity that includes a high reflection (HR) mirror, a first DBR section, and an active section positioned between the HR mirror and the first DBR section, the first DBR section including a first DBR grating with a length L1 in a range from 10 micrometers to 30 micrometers and a first kappa κ1, wherein κ1L1 is in a range from 0.5 to 1.0; and
   a second DBR section coupled to the FP cavity, the second DBR section including a second DBR grating with a second kappa κ2 that is less than the first kappa κ1 of the first DBR section.

2. The two-kappa DBR laser of claim 1, wherein a length L2 of the second DBR section is in a range from 120 micrometers to 250 micrometers and wherein κ2L2 is in a range from 0.5 to 1.0.

3. The two-kappa DBR laser of claim 1, wherein:
   the two-kappa DBR laser is configured to operate in a lasing mode;
   the two-kappa DBR laser has a DBR reflection profile that includes a DBR reflection peak; and
   the lasing mode is aligned to a long wavelength edge of the DBR reflection peak.

4. The two-kappa DBR laser of claim 3, wherein the long wavelength edge of the DBR reflection peak has a slope greater than 0.002 gigahertz$^{-1}$ (GHz$^{-1}$) at the lasing mode.

5. The two-kappa DBR laser of claim 1, further comprising a photon-photon resonance frequency in a range from 20 gigahertz to 80 gigahertz.

6. The two-kappa DBR laser of claim 1, further comprising a first bias contact electrically coupled to a first portion of the second DBR section and a second bias contact electrically coupled to a second portion of the second DBR section, wherein a photon-photon resonance frequency of the two-kappa DBR laser is tunable in response to application of tuning current to the first bias contact or the second bias contact.

7. The two-kappa DBR laser of claim 1, wherein a 3 decibel (dB) bandwidth of the two-kappa DBR laser at room temperature is at least 60 gigahertz.

8. The two-kappa DBR laser of claim 1, wherein during lasing the first DBR section is configured to confine reactive photons to the active section.

9. The two-kappa DBR laser of claim 8, wherein during lasing a distribution of the reactive photons drops by at least 50% through the first DBR section from the active section to the second DBR section.

10. A two-kappa distributed Bragg reflector (DBR) laser, comprising:
- an active section;
- a high reflection (HR) mirror coupled to a rear of the active section;
- a first DBR section coupled to a front of the active section, the first DBR section having a first DBR grating with a first kappa κ1; and
- a second DBR section coupled to a front of the first DBR section such that the first DBR section is positioned between the active section and the second DBR section, the second DBR section having a second DBR grating with a second kappa κ2 that is less than the first kappa κ1,
- wherein the two-kappa DBR laser is configured to operate in a lasing mode and has a DBR reflection profile that includes a DBR reflection peak and wherein the lasing mode is aligned to a long wavelength edge of the DBR reflection peak.

11. The two-kappa DBR laser of claim 10, wherein a length L1 of the first DBR section is in a range from 10 micrometers to 30 micrometers and κ1L1 is in a range from 0.5 to 1.0.

12. The two-kappa DBR laser of claim 10, wherein a length L2 of the second DBR section is in a range from 120 micrometers to 250 micrometers and κ2L2 is in a range from 0.5 to 1.0.

13. The two-kappa DBR laser of claim 10, wherein the long wavelength edge of the DBR reflection peak has a slope of at least 0.002 gigahertz$^{-10}$ (GHz$^{-10}$) at the lasing mode.

14. The two-kappa DBR laser of claim 10, further comprising a photon-photon resonance frequency in a range from 20 gigahertz to 80 gigahertz.

15. The two-kappa DBR laser of claim 10, further comprising a first bias contact electrically coupled to a first portion of the second DBR section and a second bias contact electrically coupled to a second portion of the second DBR section, wherein a photon-photon resonance frequency of the two-kappa DBR laser is tunable by application of tuning current to the first bias contact or the second bias contact.

16. The two-kappa DBR laser of claim 10, wherein during lasing the first DBR section is configured to confine reactive photons to the active section.

17. The two-kappa DBR laser of claim 16, wherein during lasing a distribution of the reactive photons has a peak value within the active section that is at least double a value of the distribution at any location within the second DBR section.

18. The two-kappa DBR laser of claim 10, further comprising a modulation contact coupled to the active section and configured to provide a modulation signal to the active section to modulate the active section, wherein modulation of the active section modulates cavity loss of the two-kappa DBR laser and increases carrier-photon resonance frequency ($F_r$) of the two-kappa DBR laser.

19. The two-kappa DBR laser of claim 10, further comprising a low reflection mirror formed at an output facet of the second DBR section.

20. The two-kappa DBR laser of claim 10, further comprising a semiconductor optical amplifier (SOA) section coupled to a front of the second DBR section.

* * * * *